(12) United States Patent
Yin

(10) Patent No.: US 12,190,765 B2
(45) Date of Patent: Jan. 7, 2025

(54) GOA CIRCUIT AND DISPLAY PANEL

(71) Applicant: Shenzhen China Star Optoelectronics Semiconductor Display Technology Co., Ltd., Shenzhen (CN)

(72) Inventor: Xiang Yin, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/642,959

(22) PCT Filed: Feb. 18, 2022

(86) PCT No.: PCT/CN2022/076826
§ 371 (c)(1),
(2) Date: Aug. 17, 2023

(87) PCT Pub. No.: WO2023/151111
PCT Pub. Date: Aug. 17, 2023

(65) Prior Publication Data
US 2024/0046830 A1 Feb. 8, 2024

(30) Foreign Application Priority Data
Feb. 14, 2022 (CN) .......................... 202210132282.5

(51) Int. Cl.
*G09G 3/20* (2006.01)
(52) U.S. Cl.
CPC ....... *G09G 3/20* (2013.01); *G09G 2300/0408* (2013.01); *G09G 2310/0267* (2013.01); *G09G 2330/08* (2013.01)

(58) Field of Classification Search
CPC ............ G09G 3/20; G09G 2300/0408; G09G 2310/0267; G09G 2330/08
See application file for complete search history.

(56) References Cited

U.S. PATENT DOCUMENTS

| | | |
|---|---|---|
| 2017/0256218 A1 | 9/2017 | Dai |
| 2019/0019470 A1 | 1/2019 | Zeng et al. |

(Continued)

FOREIGN PATENT DOCUMENTS

| | | |
|---|---|---|
| CN | 105336291 A | 2/2016 |
| CN | 110007628 A | 7/2019 |

(Continued)

OTHER PUBLICATIONS

Chinese Office Action issued in corresponding Chinese Patent Application No. 202210132282.5 dated Mar. 25, 2023, pp. 1-10.

(Continued)

*Primary Examiner* — Lixi C Simpson
(74) *Attorney, Agent, or Firm* — Menachem Nathan; Nathan & Associates

(57) ABSTRACT

The present application provides a GOA circuit and a display panel. The GOA circuit includes a plurality of cascaded GOA units. Every GOA unit includes a pull-up control module, a pull-up output module, a pull-down control module, a pull-down output module, a pull-down maintenance module, and a random location module. By adding the random location module in the GOA unit, the GOA circuit has a function of randomly selecting rows and outputting scanning signals, so as to realize a purpose of randomly selecting rows for mobility detection and compensation.

20 Claims, 7 Drawing Sheets

(56) References Cited

U.S. PATENT DOCUMENTS

2021/0027734 A1    1/2021  Shan
2021/0335305 A1*  10/2021  Mi .......................... G11C 19/28

FOREIGN PATENT DOCUMENTS

| CN | 110164391 A | 8/2019 | |
|---|---|---|---|
| CN | 111192550 A | 5/2020 | |
| CN | 113808533 A | 12/2021 | |
| CN | 113808534 A | 12/2021 | |
| CN | 113889020 A | 1/2022 | |
| JP | 2009169384 A | 7/2009 | |
| WO | 2020077897 A1 | 4/2020 | |
| WO | WO-2021168965 A1 * | 9/2021 | ............... G09G 3/20 |

OTHER PUBLICATIONS

International Search Report in International application No. PCT/CN2022/076826, mailed on Nov. 10, 2022.
Written Opinion of the International Search Authority in International application No. PCT/CN2022/076826, mailed on Nov. 10, 2022.

* cited by examiner

GOA CIRCUIT AND DISPLAY PANEL

BACKGROUND

Field of Invention

The present application relates to a display field, and particularly to a GOA circuit and a display panel.

Description of Prior Art

Gate driver on array (GOA) is a driving method that integrates a gate driver circuit onto an array substrate of a display panel to realize progressive scanning. The driving technology can eliminate gate drivers, and has advantages of reducing production cost and realizing a design of a narrow-frame panel, and is used for a variety of display devices.

Generally, when external compensation pixel circuits such as three transistors and one capacitor (3T1C) are used for real-time mobility detection and compensation, if detection and compensation are carried out line-by-line according to a scanning order, there will be obvious visible mura lines on a display screen, which will affect a display image quality. Therefore, it is necessary to use a horizontal blank time of a random line for detection and compensation, so as to ensure that the detection and compensation can be completed without affecting the display image quality. Therefore, it is urgent to provide a GOA circuit with random line selection function to realize random line selection detection and compensation.

SUMMARY

The present application provides a light emitting circuit and a display panel, so as to realize the purpose of randomly selecting lines for mobility detection and compensation and improve the display image quality.

The present application provides a light emitting circuit, comprising:

A driver on array (GOA) circuit, comprising a plurality of cascaded GOA units, and an nth level GOA unit comprising a pull-up control module, a pull-up output module, a pull-down control module, a pull-down output module, a pull-down maintenance module, and a random location module; wherein the pull-up control module is configured to receive a (n−m)th stage transmission signal and is electrically connected to a pull-up node for outputting the (n−m)th stage transmission signal to the pull-up node under a control of the (n−m)th stage transmission signal; both n and m are integers greater than 0, and n>m;

the pull-up output module is configured to receive a first clock signal and a second clock signal, and is electrically connected to the pull-up node, an nth stage scanning signal output end, and an nth stage transmission signal output end for outputting an nth stage scanning signal and an nth stage transmission signal under a control of a potential of the pull-up node, the first clock signal, and the second clock signal;

the pull-down control module is configured to receive a (n+m)th stage transmission signal, a control signal, and a first reference low-level signal, and is electrically connected to the pull-up node for pulling down the potential of the pull-up node under a control of the (n+m)th stage transmission signal, the control signal, and the first reference low-level signal;

the pull-down maintenance module is configured to receive a low-frequency clock signal, the (n−m)th stage transmission signal, the first reference low-level signal, and a second reference low-level signal, and is electrically connected to the pull-up node and a pull-down node for maintaining the potential of the pull-down node;

the pull-down output module is configured to receive the first reference low-level signal and a third reference low-level signal, and is electrically connected to the pull-down node, the nth stage scanning signal output end, and the nth stage transmission signal output end for pulling down a potential of the nth stage scanning signal and a potential of the nth stage transmission signal under a control of the first reference low-level signal and the third reference low-level signal; and the random location module is configured to receive the (n−m)th stage transmission signal, the first reference low-level signal, a selection signal, a reset signal, and a reference high-level signal for pulling up the potential of the pull-up node during a horizontal blank period under a control of the (n−m)th stage transmission signal, the first reference low-level signal, the selection signal, the reset signal, and the reference high-level signal.

Alternatively, in some embodiments of the present application, the pull-up control module comprises a first transistor and a second transistor;

a gate electrode of the first transistor, a source electrode of the first transistor, and a gate electrode of the second transistor are configured to receive the (n−m)th stage transmission signal transmission; a drain electrode of the first transistor and a source electrode of the second transistor are electrically connected to the first node, and a drain electrode of the second transistor is electrically connected to the pull-up node;

the pull-up output module comprises a third transistor, a fourth transistor and, a first capacitor; and a gate electrode of the third transistor, a gate electrode of the fourth transistor, and an end of the first capacitor are electrically connected to the pull-up node, a source electrode of the third transistor is configured to receive the first clock signal, a source electrode of the fourth transistor is configured to receive the second clock signal, a drain electrode of the third transistor is electrically connected to the nth stage signal output end, and a drain electrode of the fourth transistor and another end of the first capacitor are electrically connected to the nth stage scanning signal output end.

Alternatively, in some embodiments of the present application, the pull-down control module comprises a fifth transistor, a sixth transistor, a seventh transistor, an eighth transistor, a ninth transistor, and a tenth transistor; and a gate electrode of the fifth transistor and a gate electrode of the sixth transistor are configured to receive the (n+m)th stage transmission signal, a source electrode of the fifth transistor and a drain electrode of the sixth transistor are electrically connected to the first node, and a drain electrode of the fifth transistor, a drain electrode of the seventh transistor, and a drain electrode of the ninth transistor are electrically connected to the pull-up node, a source electrode of the sixth transistor, a source electrode of the eighth transistor, and a source electrode of the tenth transistor are configured to receive the first reference low-level signal, a gate electrode of the seventh transistor and a gate electrode of the eighth transistor are configured to receive the control signal, a drain electrode of the seventh transistor and a source electrode of the eighth transistor are electrically connected to the first node, a gate electrode of the ninth transistor and a gate electrode of the tenth transistor are electrically connected to the pull-down node, and a source electrode of the ninth transistor and a drain electrode of the tenth transistor are electrically connected to the first node.

Alternatively, in some embodiments of the present application, the pull-down maintenance module comprises an eleventh transistor, a twelfth transistor, a thirteenth transistor, a fourteenth transistor, a fifteenth transistor, a sixteenth transistor, and a seventeenth transistor; and a gate electrode of the eleventh transistor, a source electrode of the eleventh transistor, a gate electrode of the twelfth transistor, and a source electrode of the fourteenth transistor are configured to receive the reference high-level signal, a drain electrode of the eleventh transistor is connected with a source electrode of the twelfth transistor; a drain electrode of the twelfth transistor, a drain electrode of the thirteenth transistor, a gate electrode of the fourteenth transistor, and a drain electrode of the sixteenth transistor are connected together, a gate electrode of the thirteenth transistor, a gate electrode of the fifteenth transistor, and a gate electrode of the sixteenth transistor are electrically connected to the pull-up node, a source electrode of the thirteenth transistor and a source electrode of the sixteenth transistor are configured to receive the second reference low-level signal, a drain electrode of the fourteenth transistor, a drain electrode of the fifteenth transistor, and a drain electrode of the seventeenth transistor are electrically connected to the pull-down node, a source electrode of the fifteenth transistor and a source electrode of the seventeenth transistor are configured to receive the first reference low-level signal, and a gate electrode of the seventeenth transistor is configured to receive the (n−m)th stage transmission signal.

Alternatively, in some embodiments of the present application, the pull-down output module comprises an eighteenth transistor and a nineteenth transistor; and a gate electrode of the eighteenth transistor and a gate electrode of the nineteenth transistor are electrically connected to the pull-down node, a source electrode of the eighteenth transistor is configured to receive the first reference low-level signal, a drain electrode of the eighteenth transistor is electrically connected to the nth stage signal output end, a source electrode of the nineteenth transistor is configured to receive the third reference low-level signal, and a drain electrode of the nineteenth transistor is connected to the nth stage scanning signal output end.

Alternatively, in some embodiments of the present application, the random location module comprises a selection unit, and the selection unit comprises a twenty-first transistor, a twenty-second transistor, a twenty-third transistor, a twenty-fourth transistor, a twenty-fifth transistor, a twenty-sixth transistor, and a second capacitor; and a gate electrode of the twenty-first transistor is configured to receive the selection signal, a source electrode of the twenty-first transistor is configured to receive the (n−m)th stage transmission signal, and a drain electrode of the twenty-first transistor, a drain electrode of the twenty-second transistor, a gate electrode of the twenty-fourth transistor, a gate electrode of the twenty-fifth transistor, and one end of the second capacitor are electrically connected to the second node, a gate electrode of the twenty-second transistor, a drain electrode of the twenty-third transistor, and a drain electrode of the twenty-fourth transistor are electrically connected to the second node, a gate electrode of the twenty-third transistor, a source electrode of the twenty-third transistor, a source electrode of the twenty-fifth transistor, and another end of the second capacitor are configured to receive the reference high-level signal, a source electrode of the twenty-fourth transistor is configured to receive the first reference low-level signal, a drain electrode of the twenty-fifth transistor is connected with the source electrode of the twenty-sixth transistor, and a drain electrode of the twenty-sixth transistor is electrically connected to the pull-up node.

Alternatively, in some embodiments of the present application, the random location module further comprises a stabilization unit, and the stabilization unit comprises a twenty-seventh transistor and a twenty-eighth transistor; and a gate electrode of the twenty-seventh transistor is configured to receive the reset signal, a source electrode of the twenty-seventh transistor is connected with a drain electrode of the twenty-eighth transistor, a drain electrode of the twenty-seventh transistor is electrically connected to the pull-down node, and a gate electrode of the twenty-eighth transistor is electrically connected to the second node, a source electrode of the twenty-eighth transistor is connected to the first low-level signal source electrode.

Alternatively, in some embodiments of the present application, the nth level GOA unit further comprises a leakage protector module, and the leakage protector module comprises a twenty-ninth transistor and a thirtieth transistor; and a gate electrode of the twenty-ninth transistor and a gate electrode of the thirtieth transistor are electrically connected to the pull-up node, a source electrode of the twenty-ninth transistor is configured to receive the reference high-level signal, a drain electrode of the twenty-ninth transistor is connected with a source electrode of the thirtieth transistor, and a drain electrode of the thirtieth transistor is electrically connected to the first node.

Alternatively, in some embodiments of the present application, the random location module has an output end, the output end is electrically connected to the pull-up node at least through a signal transmission line, and the GOA circuit further comprises at least a repair line, and the repair line and the signal transmission line cross and are arranged in different layers.

Alternatively, in some embodiments of the present application, the GOA circuit comprises K first clock signals and K second clock signals, every K adjacent GOA units are configured to receive the first clock signal and the second clock signal correspondingly and respectively, and the GOA circuit comprises a plurality of repair lines, and each of the repair lines is arranged corresponding to the K adjacent GOA units.

Alternatively, in some embodiments of the present application, each of the signal transmission lines is provided with a first laser mark, and the first laser mark is arranged at an end of a corresponding one of the signal transmission lines close to the random location module.

Alternatively, in some embodiments of the present application, the repair line is provided with a plurality of repair marks, and intersections of a plurality of the signal transmission lines and the repair line correspond to the repair marksin a one-to-one correspondence.

Alternatively, in some embodiments of the present application, a plurality of second laser marks are arranged on the repair line, and each of the second laser mark is arranged between two adjacent repair marks.

Alternatively, in some embodiments of the present application, the repair marks and the second laser marks are different image marks.

Alternatively, in some embodiments of the present application, the random location module comprises a selection unit, and the selection unit comprises a twenty-first transistor, a twenty-second transistor, a twenty-third transistor, a twenty-fourth transistor, a twenty-fifth transistor, a twenty-sixth transistor, and a second capacitor;

a gate electrode of the twenty-first transistor is configured to receive the selection signal, a source electrode of the twenty-first transistor is configured to receive the (n−m)th stage transmission signal, and a drain electrode of the twenty-first transistor, a drain electrode of the twenty-second transistor, a gate electrode of the twenty-fourth transistor, a gate electrode of the twenty-fifth transistor, and one end of the second capacitor are electrically connected to the second node, a gate electrode of the twenty-second transistor, a drain electrode of the twenty-third transistor, and a drain electrode of the twenty-fourth transistor are electrically connected to the second node, and a gate electrode of the twenty-third transistor, a source electrode of the twenty-third transistor, a source electrode of the twenty-fifth transistor, and another end of the second capacitor are configured to receive the reference high-level signal, a source electrode of the twenty-fourth transistor is configured to receive the first reference low-level signal, a drain electrode of the twenty-fifth transistor is connected with the source electrode of the twenty-sixth transistor, and a drain electrode of the twenty-sixth transistor is electrically connected to the pull-up node; and the output end is arranged at the drain electrode of the twenty-sixth transistor, alternatively the output end is arranged at the connection between the twenty-fifth transistor and the source electrode of the twenty-sixth transistor.

Alternatively, in some embodiments of the present application, the repair line comprises a repair main line and a plurality of repair branch lines connected with the repair main line, each of the signal transmission lines comprises a transmission main line and a transmission branch line connected with the transmission main line, and the repair branch lines and the transmission branch lines extend in a same direction and are arranged in a one-to-one correspondence.

Accordingly, the application also provides a display panel, comprising a display area and a non-display area connected to the display area, the display panel comprising a GOA circuit disposed in the non-display area, the GOA circuit is configured to output scanning signals to the display area, and the GOA circuit comprising:

a plurality of cascaded GOA units, wherein an nth level GOA unit comprise a pull-up control module, a pull-up output module, a pull-down control module, a pull-down output module, a pull-down maintenance module, and a random location module; wherein the pull-up control module is configured to receive a (n−m)th stage transmission signal and is electrically connected to a pull-up node for outputting the (n−m)th stage transmission signal to the pull-up node under a control of the (n−m)th stage transmission signal; both n and m are integers greater than 0, and n>m;

the pull-up output module is configured to receive a first clock signal and a second clock signal, and is electrically connected to the pull-up node, an nth stage scanning signal output end, and an nth stage transmission signal output end for outputting an nth stage scanning signal and an nth stage transmission signal under a control of a potential of the pull-up node, the first clock signal, and the second clock signal;

the pull-down control module is configured to receive a (n+m)th stage transmission signal, a control signal, and a first reference low-level signal, and is electrically connected to the pull-up node for pulling down the potential of the pull-up node under a control of the (n+m)th stage transmission signal, the control signal, and the first reference low-level signal;

the pull-down maintenance module is configured to receive a low-frequency clock signal, the (n−m)th stage transmission signal, the first reference low-level signal, and a second reference low-level signal, and is electrically connected to the pull-up node and a pull-down node for maintaining the potential of the pull-down node;

the pull-down output module is configured to receive the first reference low-level signal and a third reference low-level signal, and is electrically connected to the pull-down node, the nth stage scanning signal output end, and the nth stage transmission signal output end for pulling down a potential of the nth stage scanning signal and a potential of the nth stage transmission signal under a control of the first reference low-level signal and the third reference low-level signal; and the random location module is configured to receive the (n−m)th stage transmission signal, the first reference low-level signal, a selection signal, a reset signal, and a reference high-level signal for pulling up the potential of the pull-up node during a horizontal blank period under a control of the (n−m)th stage transmission signal, the first reference low-level signal, the selection signal, the reset signal, and the reference high-level signal.

Alternatively, in some embodiments of the present application, the random location module has an output end, the output end is electrically connected to the pull-up node at least through signal transmission lines, and the GOA circuit further comprises at least a repair line, and the repair line and the signal transmission line cross and are arranged in different layers.

Alternatively, in some embodiments of the present application, the GOA circuit comprises K first clock signals and K second clock signals, every K adjacent GOA units are configured to receive the first clock signal or the second clock signal correspondingly and respectively, and the GOA circuit comprises a plurality of repair lines, and each of the repair lines is arranged corresponding to the K adjacent GOA units.

Alternatively, in some embodiments of the present application, each of the signal transmission lines is provided with a first laser mark, and the first laser mark is arranged at an end of a corresponding one of the signal transmission lines close to the random location module.

The present application provides a GOA circuit and a display panel. GOA circuit includes a plurality of cascaded GOA units. Every GOA unit includes pull-up control module, pull-up output module, pull-down control module, pull-down output module, pull-down maintenance module, and random location module. By adding a random location module in the GOA unit, the GOA circuit has a function of randomly selecting lines and outputting scanning signals in the blanking period of each frame, so as to realize a purpose of randomly selecting lines for mobility detection and compensation, and then improve the display image quality of the display panel.

BRIEF DESCRIPTION OF DRAWINGS

In order to explain the technical solutions in the embodiments of the present application more clearly, the following will briefly introduce the drawings needed in the description of the embodiments. Obviously, the drawings in the following description are only some embodiments of the present application. For those skilled in the art, other drawings can be obtained based on these drawings without creative work.

DETAILED DESCRIPTION OF PREFERRED EMBODIMENTS

In the following, the technical scheme in the embodiment of the present application will be described clearly and completely in combination with the drawings. Obviously, the described embodiments are only a part of the embodiments of the present application, rather than all the embodiments. Based on the embodiments of the present application, all other embodiments obtained by those skilled in the art without creative work fall within the protection scope of the present application.

In the description of the present application, it should be understood that the terms "first" and "second" are only used for descriptive purposes and can not be understood as indicating or implying relative importance or implicitly indicating the number of indicated technical features. Thus, the features defining "first" and "second" may explicitly or implicitly include one or more of the features. Therefore, it cannot be understood as a limitation on the present application.

The present application provides a GOA circuit and a display panel described in detail below. It should be noted that the order of description of the following embodiments does not limit the preferred order of the embodiments of the present application.

Figure 1:
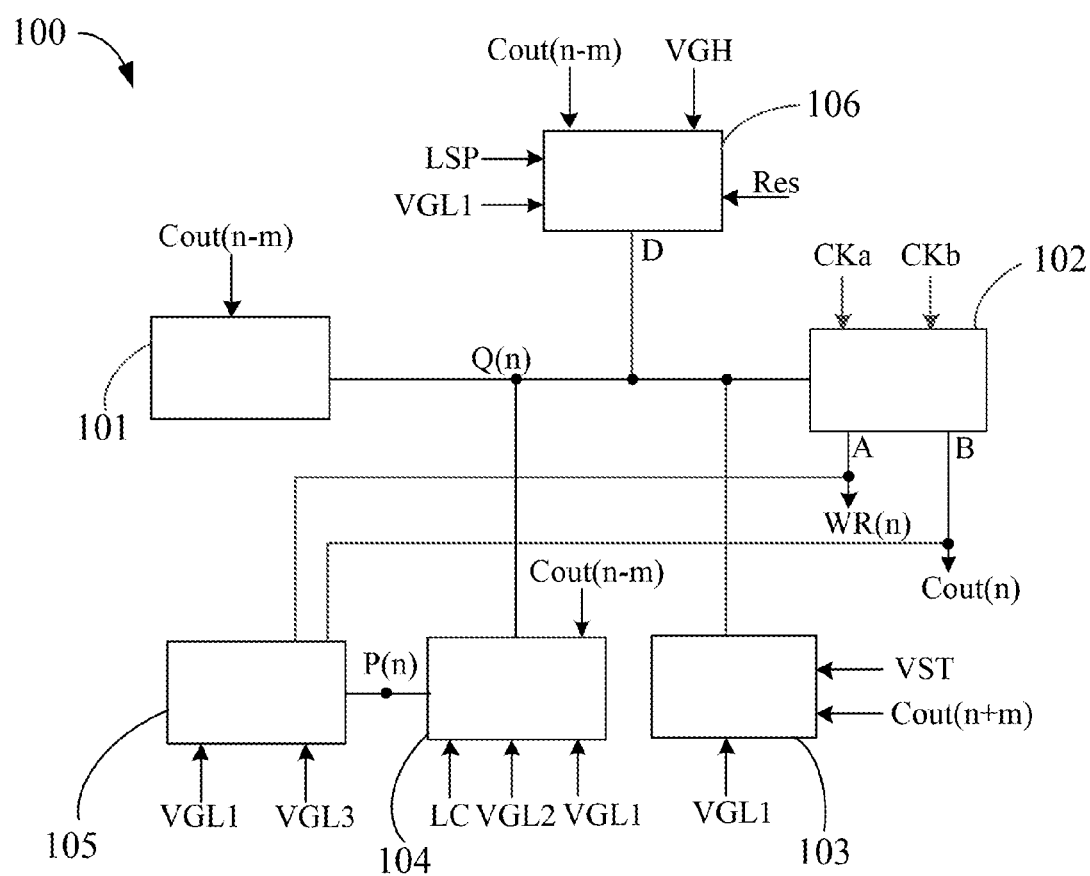
FIG. 1 is a first structural schematic diagram of an nth level GOA unit provided by the present application.

Referring to FIG. 1, FIG. 1 is a first structural schematic diagram of an nth level GOA unit provided by the present application. In the embodiments of the present application, the GOA circuit includes a plurality of cascaded GOA units 100. An nth level GOA unit 100 includes a pull-up control module 101, a pull-up output module 102, a pull-down control module 103, a pull-down maintenance module 104, a pull-down output module 105, and a random location module 106.

The pull-up control module 101 is configured to receive a (n−m)th stage transmission signal Cout(n−m) and is electrically connected to a pull-up node Q(n). The pull-up control module 101 is configured to output the (n−m)th stage transmission signal Cout(n−m) to the pull-up node Q(n) under a control of the (n−m)th stage transmission signal Cout(n−m). Both n and m are integers greater than 0, and n>m.

It should be noted that in the GOA circuit, for a prior to m-level GOA unit 100, the (n−m)th stage transmission signal Cout(n−m) does not exist. Therefore, in the prior to m-level GOA unit 100, a start signal can be configured instead of the (n−m)th stage transmission signal Cout(n−m), which will not be described one by one here. Similarly, for a later m-level GOA unit 100, the (n+m)th stage transmission signal Cout(n+m) does not exist. Therefore, in the later m-level GOA unit 100, the start signal or another signal can also be configured to replace the (n+m)th stage transmission signal Cout(n+m). It should be noted that in addition to the above differences, the circuit structure and signal connection of the prior to m-level GOA unit 100 and the later M-level GOA unit 100 are the same as those of other levels of GOA unit 100, which will not be repeated here.

The pull-up output module 102 is configured to receive a first clock signal CKa and a second clock signal CKb and is electrically connected to the pull-up node Q(n), an nth stage scanning signal output end A, and an nth stage transmission signal output end B. The pull-up output module 102 is configured to output an nth stage scanning signal WR(n) and an nth stage transmission signal Cout(n) under a control of a potential of the pull-up node Q(n), the first clock signal CKa, and the second clock signal CKb.

The pull-down control module 103 is configured to receive a (n+m)th stage transmission signal Cout(n+m), a control signal VST, and a first reference low-level signal VGL1, and is electrically connected to the pull-up node Q(n). The pull-down control module 103 is configured to pull down the potential of the pull-up node Q(n) under a control of the (n+m)th stage transmission signal Cout(n+m), the control signal VST, and the control signal VST.

The pull-down maintenance module 104 is configured to receive a low-frequency clock signal LC, the (n−m)th stage transmission signal Cout(n−m), the first reference low-level signal VGL1, and a second reference low-level signal VGL2, and is electrically connected to the pull-up node Q(n) and a pull-down node P(n). The pull-down maintenance module 104 is configured to maintain the potential of the pull-down node P(n).

The pull-down output module 105 is configured to receive the first reference low-level signal VGL1 and a third reference low-level signal VGL3, and is electrically connected to the pull-down node P(n), the nth stage scanning signal output end A, and the nth stage transmission signal output end B. The pull-down output module 105 is configured to pull down a potential of the nth stage scanning signal WR(n) and a potential of the nth stage transmission signal Cout(n) under a control of the potential of the pull-down node P(n), the first reference low-level signal VGL1 and the third reference low-level signal VGL3.

The random location module 106 is configured to receive the (n−m)th stage transmission signal Cout(n−m), the first reference low-level signal VGL1, a selection signal LSP, a reset signal Res, and a reference high-level signal VGH. The random location module 106 is configured to pull up the potential of the pull-up node Q(n) during a horizontal blank period under a control of the (n−m)th stage transmission signal Cout(n−m), the first reference low-level signal VGL1, the selection signal LSP, the reset signal Res, and the reference high-level signal VGH.

Understandably, in general, the potential of the pull-up node Q(n) remains low during the horizontal blank period. The pull-up output module 102 is closed, and the nth level GOA unit 100 does not output a scanning signal. In the embodiments of the present application, the random location module 106 pulls up the potential of the pull-up node Q(n) in the horizontal blank period, so that the pull-up output module 102 is in an open state, and then outputs the scanning signal for mobility detection and compensation under the action of the second clock signal CKb.

Therefore, in the embodiments of the present application, by adding a random location module 106 in the GOA unit 100, the GOA circuit has a function of randomly selecting lines and outputting scanning signals in the blanking period of each frame. Thus, the purpose of randomly selecting lines for mobility detection and compensation is realized, and display image quality of the display panel is improved.

Figure 2:
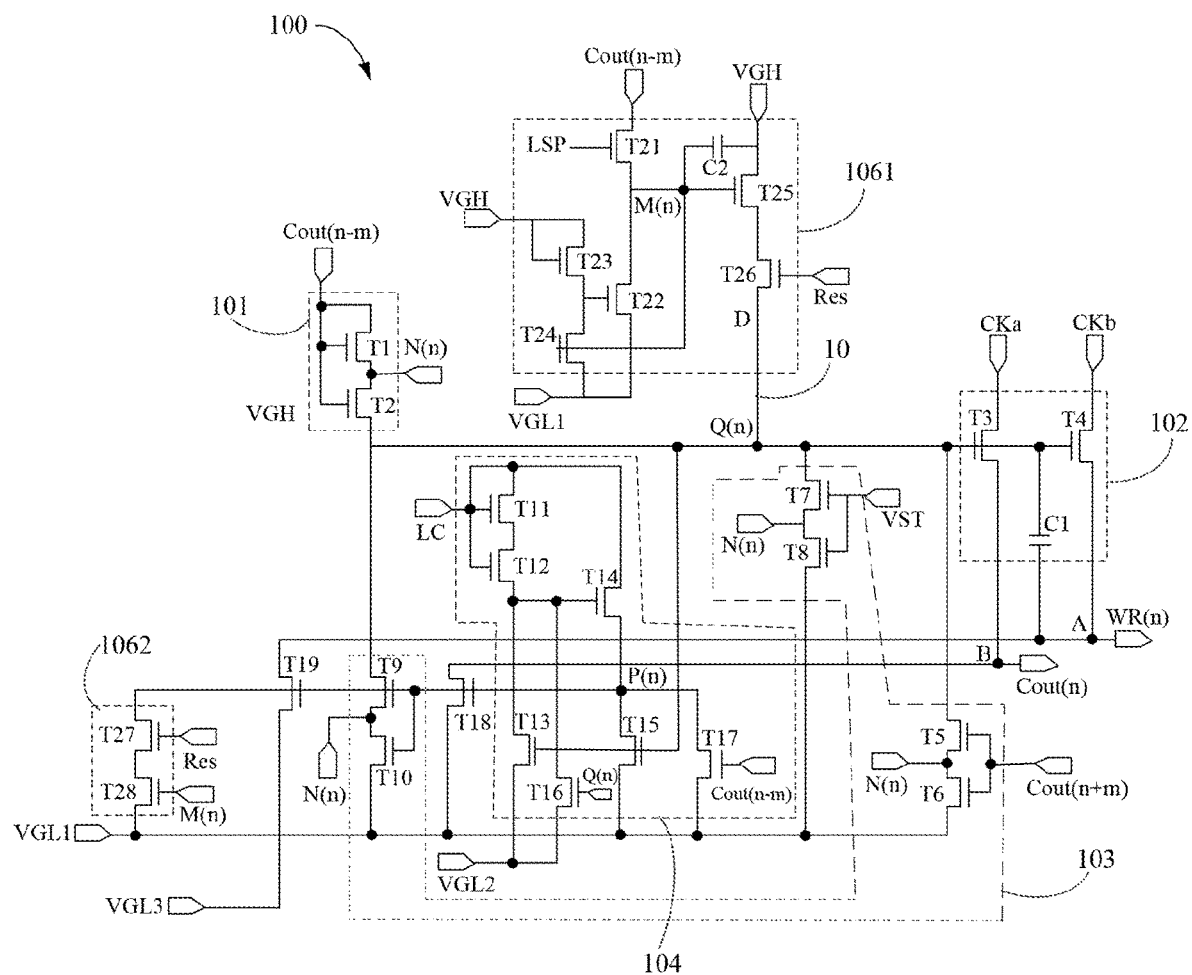
FIG. 2 is a circuit diagram of the nth level GOA unit shown in FIG. 1 provided by the present application.

Referring to FIG. 1 and FIG. 2. FIG. 2 is a circuit diagram of the nth level GOA unit shown in FIG. 1 provided by the present application. In some embodiments of the present application, the pull-up control module 101 includes a first transistor T1 and a second transistor T2.

A gate electrode of the first transistor T1, a source electrode of the first transistor T1, and a gate electrode of the second transistor T2 are configured to receive the (n−m)th stage transmission signal transmission Cout(n−m), a drain electrode of the first transistor T1 and a source electrode of the second transistor T2 are electrically connected to a first node N(n), and a drain electrode of the second transistor T2 is electrically connected to the pull-up node Q(n).

In some embodiments of the present application, the pull-up output module 102 comprises a third transistor T3, a fourth transistor t4, and a first capacitor C1.

A gate electrode of the third transistor T3, a gate electrode of the fourth transistor T4, and an end of the first capacitor C1 are electrically connected to the pull-up node Q(n). A source electrode of the third transistor T3 is configured to receive the first clock signal CKa. A source electrode of the fourth transistor T4 is configured to receive the second clock signal CKb. A drain electrode of the third transistor T3 is electrically connected to the nth stage signal output end B. A drain electrode of the fourth transistor T4 and another end of the first capacitor C1 are electrically connected to the nth stage scanning signal output A.

In some embodiments of the present application, the pull-down control module 103 includes a fifth transistor T5, a sixth transistor T6, a seventh transistor T7, an eighth transistor T8, a ninth transistor T9, and a tenth transistor T10.

A gate electrode of the fifth transistor T5 and a gate electrode of the sixth transistor T6 are configured to receive the (n+m)th stage transmission signal Cout(n+m). A source electrode of the fifth transistor T5 and a drain electrode of the sixth transistor T6 are electrically connected to the first node N(n). A drain electrode of the fifth transistor T5, a drain electrode of the seventh transistor T7, and a drain of the ninth transistor T9 are electrically connected to the pull-up node Q(n). A source electrode of the sixth transistor T6, a source electrode of the eighth transistor T8, and a source electrode of the tenth transistor T10 are configured to receive the first reference low-level signal VGL1. A gate electrode of the seventh transistor T7 and a gate electrode of the eighth transistor T8 are configured to receive the control signal VST. A drain electrode of the seventh transistor T7 and a source electrode of the eighth transistor T8 are electrically connected to the first node N(n). A gate electrode of the ninth transistor T9 and a gate electrode of the tenth transistor T10 are electrically connected to the pull-down node P(n). A source electrode of the ninth transistor T9 and a drain electrode of the tenth transistor T10 are electrically connected to the first node N(n).

In some embodiments of the present application, the pull-down maintenance module 104 includes an eleventh transistor T11, a twelfth transistor T12, a thirteenth transistor T13, a fourteenth transistor T14, a fifteenth transistor T15, a sixteenth transistor T16, and a seventeenth transistor T17.

A gate electrode of the eleventh transistor T11, a source electrode of the eleventh transistor T11, a gate electrode of the twelfth transistor T12, and a source electrode of the fourteenth transistor T14 are configured to receive the reference high-level signal VGH. A drain electrode of the eleventh transistor T11 is connected with a source electrode of the twelfth transistor T12. A drain electrode of the twelfth transistor T12, a drain electrode of the thirteenth transistor T13, a gate electrode of the fourteenth transistor T14, and a drain electrode of the sixteenth transistor T16 are connected together. A gate electrode of the thirteenth transistor T13, a gate electrode of the fifteenth transistor T15, and a gate electrode of the sixteenth transistor T16 are electrically connected to the pull-up node Q(n). A source electrode of the thirteenth transistor T13 and a source electrode of the sixteenth transistor T16 are configured to receive the second reference low-level signal VGL2. A drain electrode of the fourteenth transistor T14, a drain electrode of the fifteenth transistor T15, and a drain electrode of the seventeenth transistor T17 are electrically connected to the pull-down node P(n). A source electrode of the fifteenth transistor T15 and a source electrode of the seventeenth transistor T17 are configured to receive the first reference low-level signal VGL1. A gate electrode of the seventeenth transistor T17 is configured to receive the (n−m)th stage transmission signal Cout(n−m).

In some embodiments of the present application, the pull-down output module 105 includes an eighteenth transistor T18 and a nineteenth transistor T19.

A gate electrode of the eighteenth transistor T18 and a gate electrode of the nineteenth transistor T19 are electrically connected to the pull-down node P(n). A source electrode of the eighteenth transistor T18 is configured to receive the first reference low-level signal VGL1. A drain electrode of the eighteenth transistor T18 is electrically connected to the nth stage signal output end B. A source electrode of the nineteenth transistor T19 is configured to receive the third reference low-level signal VGL3. A drain electrode of the nineteenth transistor T19 is connected to the nth stage scanning signal output end A.

In some embodiments of the present application, the random location module 106 includes a selection unit 1061. The selection unit 1061 is configured to receive the (n−m)th stage transmission signal Cout(n−m), the first reference low-level signal VGL1, the selection signal LSP, the reset signal Res, and the reference high-level signal VGH. The selection unit 1061 is configured to pull up the potential of the pull-up node Q(n) during the horizontal blank period.

Specifically, the selection unit 1061 includes a twenty-first transistor T21, a twenty-second transistor T22, a twenty-third transistor T23, a twenty-fourth transistor T24, a twenty-fifth transistor T25, a twenty-sixth transistor T26, and a second capacitor C2.

A gate electrode of the twenty-first transistor T21 is configured to receive the selection signal LSP, and a source electrode of the twenty-first transistor T21 is configured to receive the n−m stage transmission signal Cout(n−m). A drain electrode of the twenty-first transistor T21, a drain electrode of the twenty-second transistor T22, a gate electrode of the twenty-fourth transistor T24, a gate electrode of the twenty-fifth transistor T25, and an end of the second capacitor C2 are electrically connected to the second node M(n). A gate electrode of the twenty-second transistor T22, a drain electrode of the twenty-third transistor T23, and a drain electrode of the twenty-fourth transistor T24 are electrically connected to the second node. A gate electrode of the twenty-third transistor T23, a source electrode of the twenty-third transistor T23, a source electrode of the twenty-fifth transistor T25, and another end of the second capacitor C2 are configured to receive the reference high-level signal VGH. A source electrode of the twenty-fourth transistor T24 is configured to receive the first reference low-level signal VGL1. A drain electrode of the twenty-fifth transistor T25 and a source electrode of the twenty-sixth transistor T26 are connected together. A drain electrode of the twenty-sixth transistor T26 is electrically connected to the pull-up node Q(n).

Further, in some embodiments of the present application, the random location module 106 further includes a stabilization unit 1062. The stabilization unit 1062 is configured to receive the reset signal Res and the first reference low-level signal VGL1, and is connected to a second node M(n). The stabilizing unit 1062 is configured to maintain the potential of the pull-down node P(n) at a low potential during the random line selection stage of the selection unit 1061, so that a scanning signal of a selected line is normally outputted in the horizontal blank period.

Specifically, the stabilization unit 1062 includes a twenty-seventh transistor T27 and a twenty-eighth transistor T28. A gate electrode of the twenty-seventh transistor T27 is configured to receive the reset signal Res. A source electrode of the twenty-seventh transistor T27 is connected with a drain electrode of the twenty-eighth transistor T28. A drain electrode of the twenty-seventh transistor T27 is electrically connected to the pull-down node P(n). A gate electrode of the twenty-eighth transistor T28 is electrically connected to the second node, and a source electrode of the twenty-eighth transistor T28 is configured to receive the first reference low-level signal VGL1.

In the embodiment of the present application, the GOA circuit is configured to receive K first clock signals CKa. The K first clock signals CKa are time-sharing effective in turn in the action cycle of the GOA circuit. That is, in the GOA circuit, every K GOA units 100 is a cascade cycle. Each K GOA unit 100 is configured to receive K first clock signals CKa in a one-to-one correspondence. Same is true for the second clock signal CKb, which will not be repeated here. In addition, the timing of the first clock signal CKa and the second clock signal CKb are same.

It can be understood that the GOA circuit includes at least two first clock signals CKa. For example, the GOA circuit includes two first clock signals CKa. The GOA circuit includes four first clock signals CKa. The GOA circuit includes eight first clock signals CKa. The GOA circuit includes 12 first clock signals CKa. Of course, the present application is not limited to the above examples. Same is true for the second clock signal CKb, which will not be repeated here.

Figure 3:
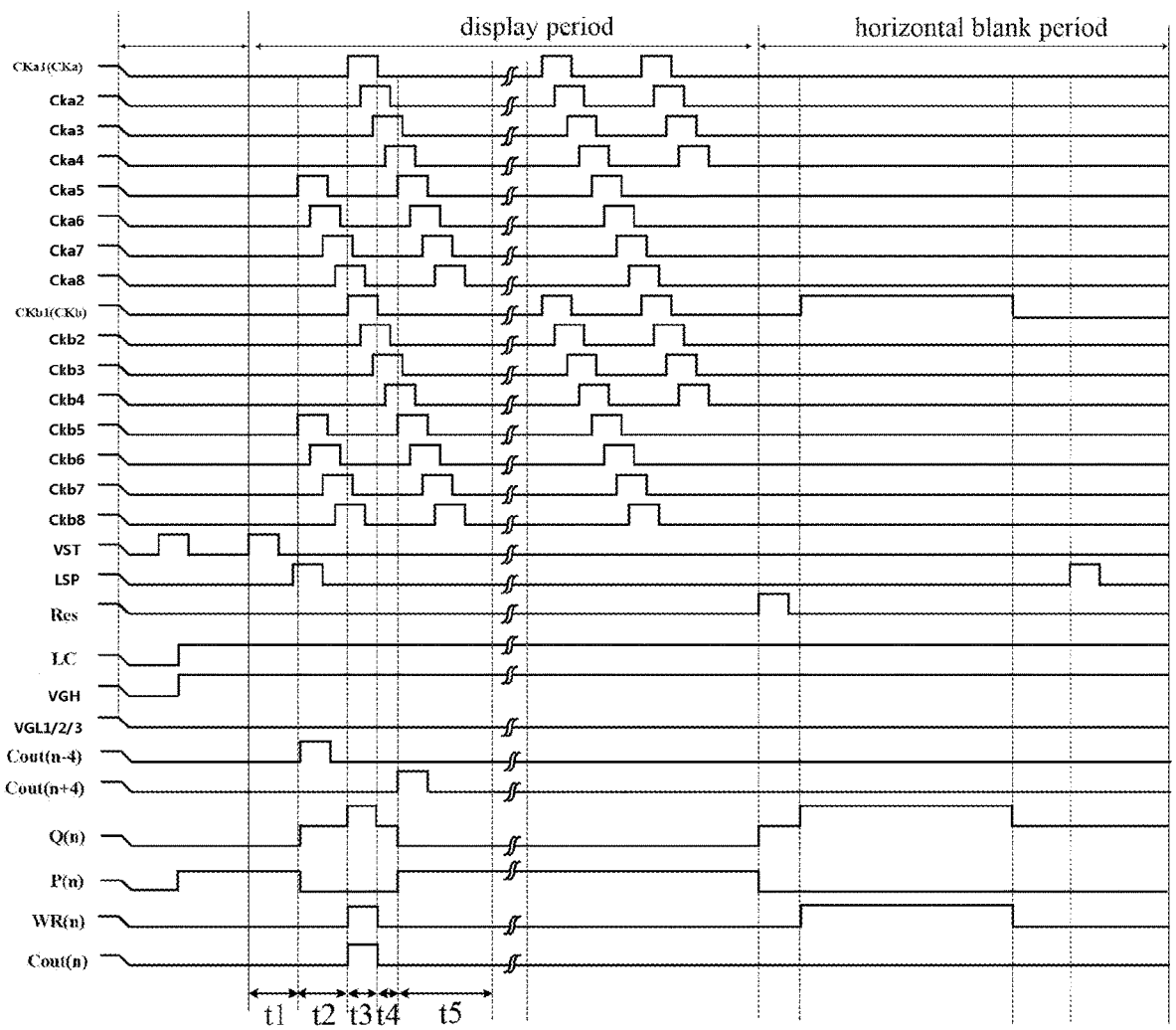
FIG. 3 is a signal timing diagram of the nth level GOA unit provided by the present application.

The following embodiments of the present application take the GOA circuit with 8 first clock signals CKa and 8 second clock signals CKb as an example. Specifically, please refer to FIG. 3 and FIG. 4. Please refer to FIG. 3, FIG. 3 is a signal timing diagram of the nth level GOA unit provided by the present application. The GOA circuit includes eight first clock signals CKa (CKa1-CKa8) and eight second clock signals CKb (CKb1-CKb8). In addition, in the embodiments of the present application, m=4.

The driving timing of the nth level GOA unit 100 includes a display period and a horizontal blank period. During the display period, the nth level GOA unit 100 outputs a scanning signal to a display panel for display. During the horizontal blank period, the nth level GOA unit 100 outputs a scanning signal for mobility detection and compensation.

Specifically, during the display period, in a first stage t1, the control signal VST is high level, and the seventh transistor T7 and the eighth transistor T8 are turned on. The first reference low-level signal VGL1 is transmitted to the pull-up node Q(n) through the eighth transistor T8 and the seventh transistor T7. The potential of the pull-down node Q(n) is low level, thereby releasing the residual charge of the pull-down node Q(n).

In a second stage t2, the (n−m)th stage transmission signal Cout(n−4) rises to a high level, and both the first transistor T1 and the second transistor T2 are turned on. The potential of the pull-up node Q(n) is pulled up to a potential of the (n−m)th stage transmission signal Cout(n−4).

At the same time, if the selection signal LSP rises to a high level, the twenty-first transistor T21 is turned on. The potential of the second node M(n) is pulled up to a potential of the reference high-level signal VGH. The twenty-fourth transistor T24 is turned on. The reference high level VGH can also be transmitted to the second node M(n) through the twenty-third transistor T23, the twenty-fourth transistor T24, and the twenty-second transistor T22 to further maintain the high potential of the second node M(n). In addition, the second capacitor C2 can also maintain the high potential of the second node M(n) throughout the display period.

Of course, if the selection signal LSP is low level, the twenty-first transistor T21 and the twenty-fourth transistor T24 are turned off. Since the twenty-second transistor T22 and the twenty-third transistor T23 are turned on, the first reference low-level signal VGL1 is transmitted to the second node M(n), and the potential of the second node M(n) is low level.

In addition, since the potential of the pull-up node Q(n) is high level, the thirteenth transistor T13, the fifteenth transistor T15, and the sixteenth transistor T16 are turned on, and the potential of the pull-down node P(n) is pulled down. Therefore, the pull-down maintenance module 104 and the pull-down output module 105 do not work to avoid pulling down the potential of the pull-up node Q(n).

In a third stage t3, the first clock signal CKa and the second clock signal CKb corresponding to the nth level GOA unit 100 change from low potential to high potential. Due to the bootstrap action, the potential of the pull-up node Q(n) is pulled up again, and the third transistor T3 and the fourth transistor T4 are turned on. Therefore, the potentials of the nth stage transmission signal Cout(n) and the nth stage scanning signal WR(n) are raised to a high potential. At this stage, the nth stage scanning signal WR(n) is outputted so that the scanning line corresponding to the nth level GOA unit 100 is charged, a row of pixels corresponding to the nth stage scanning line is opened, and the row of pixels are lit. In addition, the first capacitor C1 can also maintain stability of the nth stage scanning signal WR(n) at this stage.

In a fourth stage t4, the first clock signal CKa and the second clock signal CKb corresponding to the nth level GOA unit 100 change from high potential to low potential. The potential of the pull-up node Q(n) drops to the potential of the n−m stage transmission signal Cout(n−4). The potentials of the nth stage transmission signal Cout(n) and the nth stage scanning signal WR(n) are pulled to a low potential.

In the fifth stage t5, the (n+4)th stage transmission signal Cout (n+4) rises to high level. The fifth transistor T5 and the sixth transistor T6 are turned on. The potential of the pull-up node Q(n) is pulled down to a potential of the first reference low level VGL1.

At this time, since the low-frequency clock signal LC has a high potential, the eleventh transistor T11, the twelfth transistor T12, and the fourteenth transistor T14 are turned on. The potential of the pull-down node P(n) is pulled up. Both the eighteenth transistor T18 and the nineteenth transistor T19 are turned on. The potential of the nth stage transmission signal Cout(n) is pulled down to the potential of the first reference low level VGL1. The potential of the nth stage scanning signal WR(n) is pulled down to the potential of the third reference low level VGL3.

It should be noted that in the embodiments of the present application, the first reference low-level signal VGL1, the second reference low-level signal VGL2 and the third reference low-level signal VGL3 can be a same signal, so as to reduce the routing complexity. Of course, in other embodiments of the present application, a potential of the third reference low level VGL3 may be higher than a potential of the first reference low level signal VGL1, so that the fourth transistor T4 is completely turned off to avoid leakage or incorrect output of the scanning signal.

During the horizontal blank period, firstly, according to the analysis of the second stage t2 above, when the potential of the selection signal LSP and the (n−m)th stage transmission signal Cout(n−4) rise to a high level at a same time, the potential of the second node M(n) is raised to a high level. The twenty-fifth transistor T25 is turned on. At this time, the reset signal Res rises to a high level, the twenty-sixth transistor T26 is turned on, the potential of the pull-up node Q(n) is pulled up, and the third transistor T3 and the fourth transistor T4 are turned on.

Then, the second clock signal CKb corresponding to the nth level GOA unit 100 increases, and the nth level GOA unit 100 outputs the nth stage scanning signal WR(n) during the horizontal blank period. That is, the random location module 106 selects a corresponding row of sub pixels for mobility detection and compensation.

At the same time, a potential of the reset signal Res and the second node M(n) are high level. The twenty-seventh transistor T27 and the twenty-eighth transistor T28 are turned on, and the potential of the pull-down node P(n) is pulled down to avoid pulling down the nth stage scanning signal WR(n).

Finally, the selection signal LSP rises to a high potential and the twenty-first transistor T21 is turned on. Due to the potential of the (n−m)th stage transmission signal Cout(n−4), the potential of the second node M(n) is pulled down to realize a potential reset.

Figure 4:
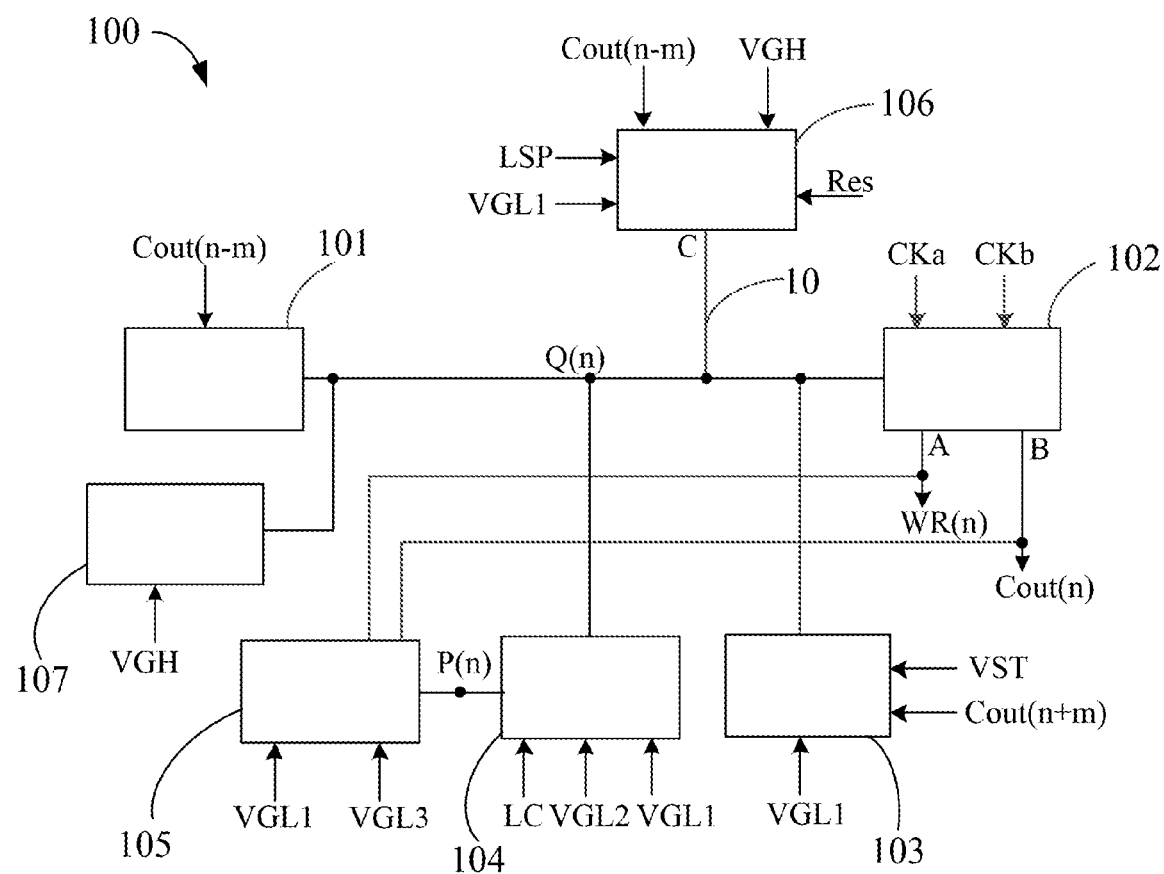
FIG. 4 is a second structural schematic diagram of an nth level GOA unit provided by the present application.
Figure 5:
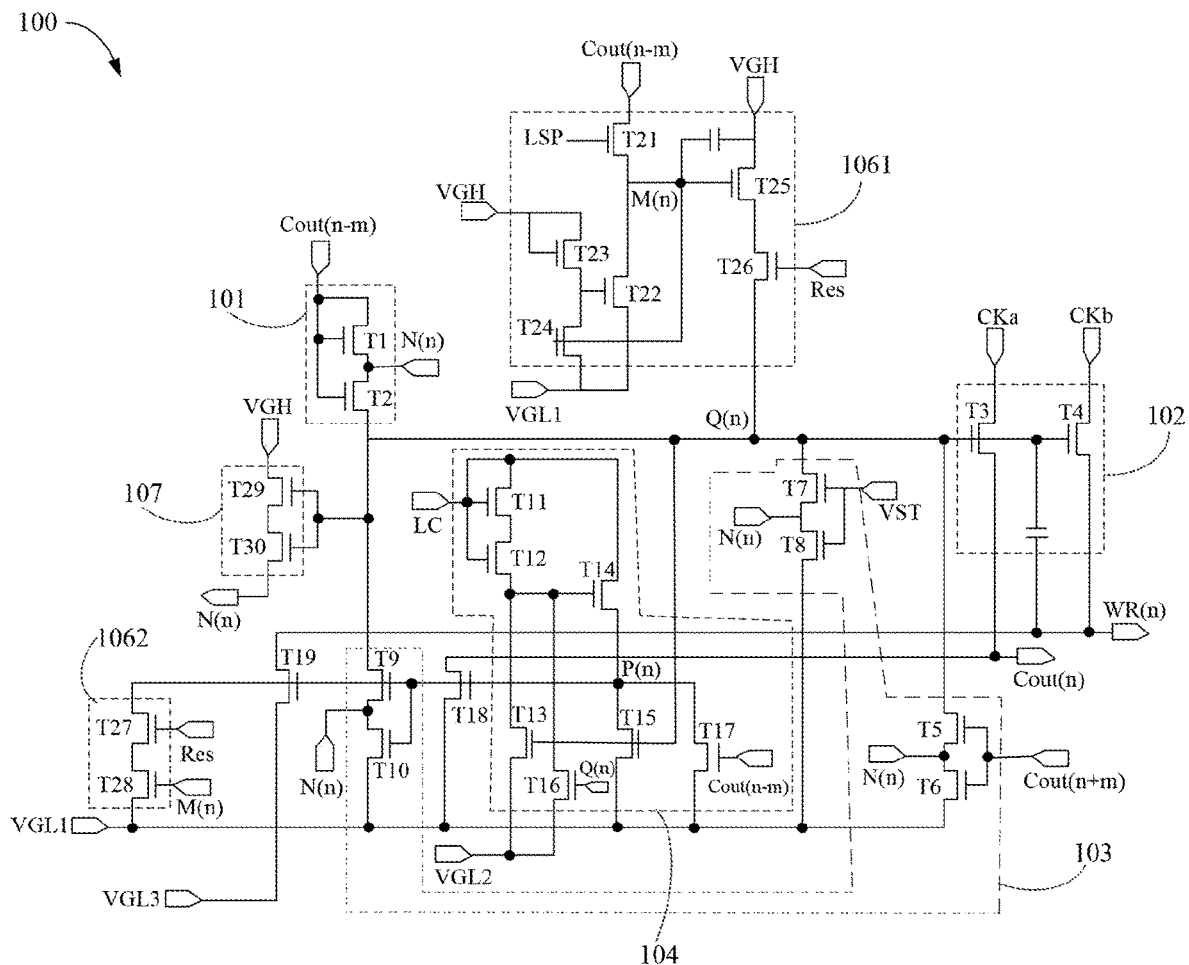
FIG. 5 is a circuit diagram of the nth level GOA unit shown in FIG. 4 provided by the present application.

Referring to FIG. 4 and FIG. 5. FIG. 4 is a second structural schematic diagram of an nth level GOA unit provided by the present application. FIG. 5 is a circuit diagram of the nth level GOA unit shown in FIG. 4 provided by the present application. The difference from the GOA unit 100 shown in FIG. 3 is that in the embodiment of the present application, the nth level GOA unit 100 also includes a leakage protector module 107.

Specifically, the leakage protector module 107 includes a twenty-ninth transistor T29 and a thirtieth transistor T30. A gate electrode of the twenty-ninth transistor T29 and a gate electrode of the thirtieth transistor T30 are electrically connected to the pull-up node Q(n). A source electrode of the twenty-ninth transistor T29 is configured to receive the reference high-level signal VGH. A drain electrode of the twenty-ninth transistor T29 is connected with a source electrode of the thirtieth transistor T30. And a drain electrode of the thirtieth transistor T30 is electrically connected to the first node N(n).

It can be understood that, referring to FIG. 3, when the potential of the pull-up node Q(n) is high level, the twenty-ninth transistor T29 and the thirtieth transistor T30 are turned on, and the first node N(n) outputs a high-level signal. At this time, the drain electrode of the fifth transistor T5, the drain electrode of the seventh transistor T7, and the drain electrode of the ninth transistor T9 are electrically connected to the first node N(n), so that the fifth transistor T5, the seventh transistor T7, and the ninth transistor T9 can be completely turned off. Thus, the leakage path of the pull-up node Q(n) is reduced and waveform stability of the nth stage transmission signal Cout(n) and the nth level scanning signal WR(n) is improved.

Figure 6:
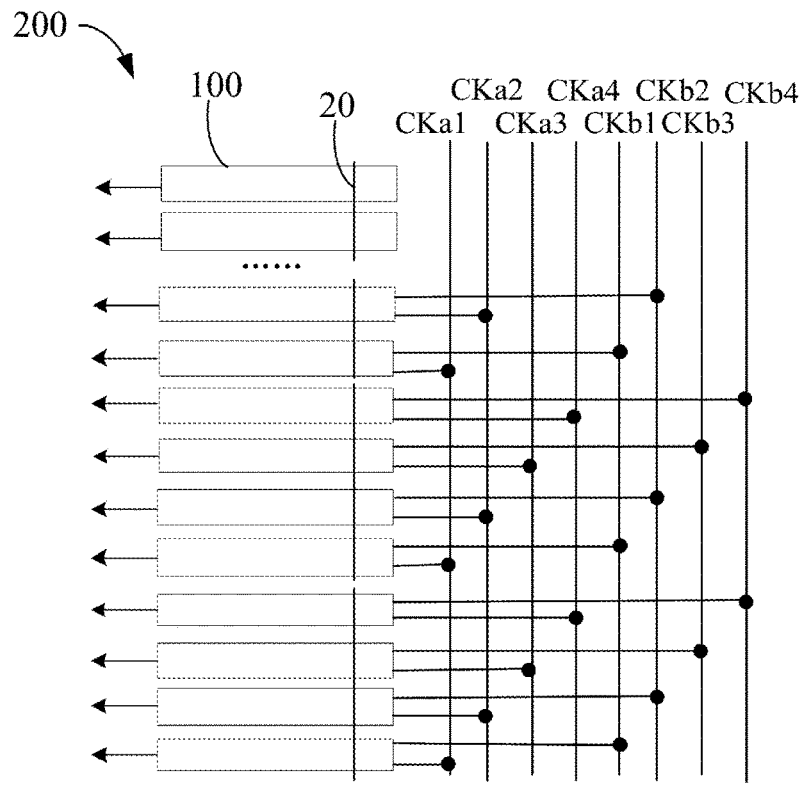
FIG. 6 is a schematic diagram of a planar structure of a GOA circuit provided by the present application.
Figure 7:
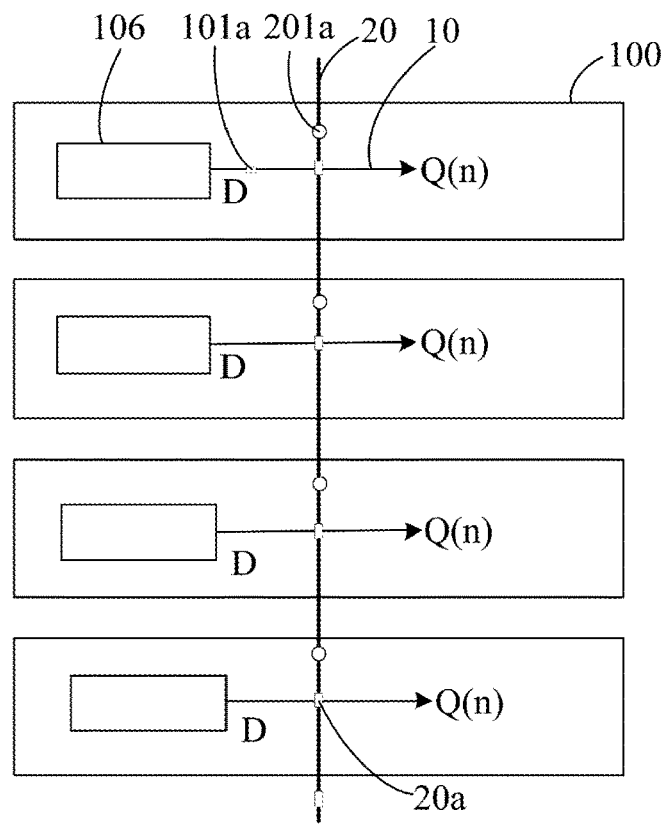
FIG. 7 is a schematic diagram of a first amplification structure of the GOA circuit shown in FIG. 6 provided by the present application.

Referring to FIG. 6 and FIG. 7. FIG. 6 is a schematic diagram of a planar structure of a GOA circuit provided by the present application. FIG. 7 is a schematic diagram of a first amplification structure of the GOA circuit shown in FIG. 6 provided by the present application.

In the embodiments of the present application, every random location module 106 has an output end D. The output end D is electrically connected to the pull-up node Q(n) at least through a signal transmission line 10. The GOA circuit 200 also includes at least a repair line 20. The repair line 20 and the signal transmission line 10 cross and are arranged in different layers.

It can be understood that there are multiple components in the random location module 106. Due to disconnection of wiring, signal interference, poor connection, component failure and other reasons, the random location module 106 may fail. The random location module 106 cannot select this GOA unit 100 according to the selection signal LSP to output the scanning signal during the horizontal blank period. Then the pixel line corresponding to the scanning signal of this GOA unit 100 cannot complete the detection and compensation of mobility, thus affecting the display quality.

In this regard, the embodiments of the present application provides a repair line 20 in the GOA circuit 200. When any random location module 106 fails, the repair line 20 is configured to electrically connect the pull-up node Q(n) of the GOA unit 100 in which the random location module 106 fails with the pull-up node Q(n) of the GOA unit 100 in which the random location module 106 works normally, so that the GOA unit 100 in which the random location module 106 fails can pull up the potential of the pull-up node Q(n) during the horizontal blank period and output the scanning signal normally, completing the detection and compensation of mobility, so as to improve the display quality.

Referring to FIG. 2, the output end D can be arranged at the drain electrode of the twenty-sixth transistor T26. At this time, the output end D is electrically connected to the pull-up node Q(n) through the signal transmission line 10. If any component in the random location unit 1061 fails, it can be repaired by the repair line 20.

Of course, in other embodiments, the twenty-sixth transistor T26 is less prone to failure because of its simple structure. Therefore, the output end D can be arranged at the source electrode connection of the twenty-fifth transistor T25 and the twenty-sixth transistor T26. At this time, the output end D is electrically connected to the pull-up node Q(n) through the twenty-sixth transistor T26 and the signal transmission line 10.

In the present application, when a random location module 106 of a GOA unit 100 fails, the pull-up node Q(n) of the GOA unit 100 and the pull-up node Q(n) of the adjacent GOA unit 100 can be shorted together through the repair line 20. The pull-up node Q(n) of the GOA unit 100 can also be shorted with the pull-up node Q(n) of a non-adjacent GOA unit 100 through the repair line 20.

In the embodiment of the present application, the repair line 20 can be set as a plurality of lines, or it can also be set as a single line. A number of repair lines 20 can be set according to a wiring space of the display panel, the number of GOA units 100, and other factors.

In some embodiments of the present application, please continue to refer to FIG. 6 and FIG. 7. The GOA circuit 200 includes K first clock signals CKa and K second clock signals CKb. Every adjacent K GOA unit 100 are configured to receive the first clock signal CKa or the second clock signal CKb correspondingly and respectively. The GOA circuit 200 comprises a plurality of repair lines 20. Each of the repair lines 20 is arranged corresponding to the K adjacent GOA units 100.

The embodiment of the present application takes an example that the GOA circuit 200 includes four first clock signals CKa (CKa1-CKa4) and four second clock signals CKb (CKb1-CKb4).

In the embodiment of the present application, a repair line 20 is arranged for every K adjacent GOA unit 100. When there are more failed random location modules 106 in the GOA circuit 200, a number of laser disconnection of the repair line 20 can be reduced, so as to save production capacity.

Further, in the embodiments of the present application, each of the signal transmission lines 10 is provided with a first laser mark 101a. The first laser mark 101a is arranged at an end of a corresponding one of the signal transmission lines 10 close to the random location module 106.

It can be understood that when the random location module 106 fails, the random location module 106 may output other error signals during the horizontal blank period, affecting the potential of the pull-up node Q(n), thereby affecting the output of the scanning signal. In the embodiments of the present application, after the pull-up node Q(n) of the two GOA units 100 is shorted together through the repair line 20, the random location module 106 is disconnected from the pull-up node Q(n) through the first laser mark 101a, which can ensure the normal output of the scanning signal during the horizontal blank period.

In some embodiments of the present application, the repair line 20 is provided with a plurality of repair marks 20a. The intersection of a plurality of the signal transmission lines 10 and the repair line 20 correspond to the repair mark 20a one by one.

It can be understood that the embodiments of the present application can connect the repair line 20 with the corresponding signal transmission line 10 by means of laser. The energy of the laser is very high. In order to avoid damaging other routing lines, the present application sets the welding repair mark 20a on the repair line 20, and makes the intersection of the signal transmission line 10 and the repair line 20 correspond to the repair mark 20a, so as to improve the accuracy of the laser. While improving a connection yield between the repair line 20 and the signal transmission line 10, laser damage to other lines is avoided.

In addition, the repair mark 20a may be a protrusion or groove arranged on the repair line 20. The repair mark 20a may also be similar to graphic marks such as "−", "+", and "×", and so on. There is no specific limitation in the present application.

In some embodiments of the present application, a plurality of second laser marks 201a are arranged on the repair line 20. Each of the second laser mark 201a is arranged between two adjacent repair markers 20a.

Similarly, the second laser mark 201a may be a protrusion or groove arranged on the repair line 20. The second laser mark 201a can also be similar graphic marks to "−", "+", and "×", and so on as set on the repair line 20. There is no specific limitation in the present application. In addition, the repair marks 20a and the second laser marks 201a can be arranged as different graphic marks to facilitate differentiation.

Understandably, when multiple random location modules 106 fail at a same time. In some embodiments, the GOA unit 100 where a plurality of random location modules 106 fail may be connected with a same working GOA unit 100. At this time, the repair line 20 is in a state shared by a plurality of GOA units 100. In order to improve the effect of mobility detection and compensation, when multiple random location modules 106 fail, only the pull-up node Q(n) of each two GOA units 100 is shorted together. At this time, since the repair line 20 can be divided into multiple sections through the second laser mark 201a, the utilization rate of the repair line 20 can be improved.

Figure 8:
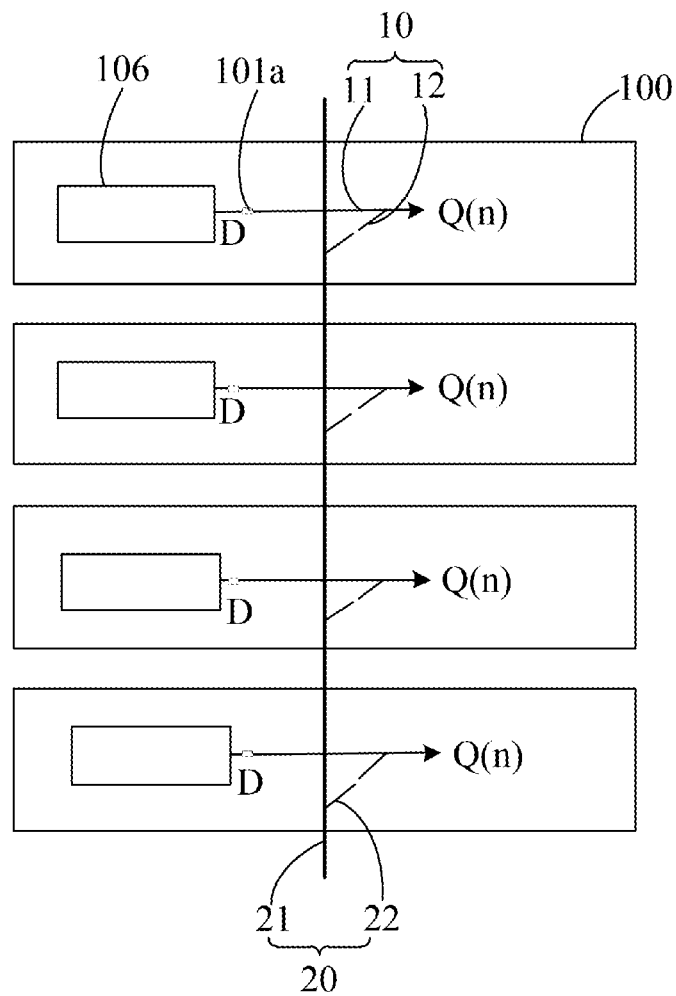
FIG. 8 is a schematic diagram of a second amplification structure of the GOA circuit shown in FIG. 6 provided by the present application.

Referring to FIG. 8, FIG. 8 is a schematic diagram of a second amplification structure of the GOA circuit shown in FIG. 6 provided by the present application. The difference from the GOA circuit shown in FIG. 7 is that in the embodiment of the present application, the repair line 20 includes a repair main line 21 and a plurality of repair branch lines 22 connected with the repair main line 21. Each of the signal transmission lines 10 includes a transmission main line 11 and a transmission branch line 12 connected with the transmission main line 11. The repair branch line 22 and the transmission branch line 12 extend in a same direction and are arranged in a one-to-one correspondence.

In the embodiments of the present application, the repair branch line 22 and the transmission branch line 12 are arranged such that when a random location module 106 of GOA unit 100 fails, repair is realized by repairing a branch line 22 and a transmission branch line 12. Since the repair branch line 22 and the repair main line 21 are arranged separately, and the transmission branch line 12 and the transmission main line 11 are arranged separately, the disconnection of the repair main line 21 during laser welding can be avoided. In addition, when the repair branch line 22 is in poor contact with the transmission branch line 12, it can also be repaired by repairing the main line 21 and the transmission main line 11, so as to improve the repair yield.

Figure 9:
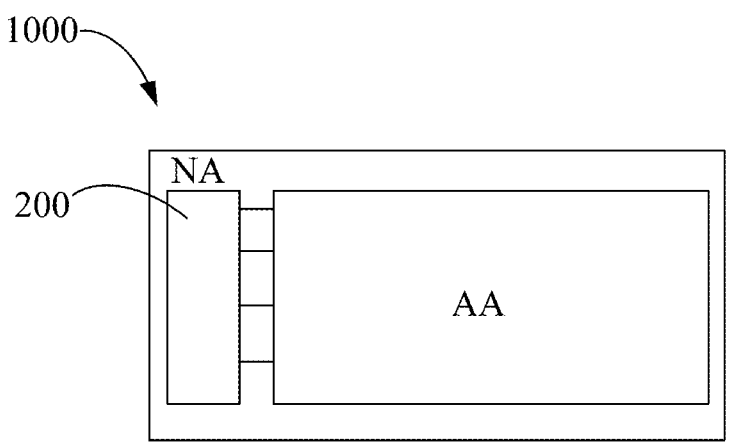
FIG. 9 is a structural schematic diagram of a display panel provided by the present application.

Accordingly, the present application also provides a display panel, which includes the GOA circuit described in any one of the above. Please refer to FIG. 9. FIG. 9 is a structural schematic diagram of a display panel provided by the present application. As shown in FIG. 9, the display panel 1000 includes a display area AA and a non-display area NA connected to the display area AA. The GOA circuit 200 is integrated in the non-display area NA. The structure and principle of the GOA circuit 200 are similar to the above GOA circuit, and will not be repeated here. It should be noted that the display panel 1000 provided in the present application takes a unilateral driving mode of GOA circuit 200 arranged on one side of display area AA as an example, but it cannot be understood as a limitation of the present application. In some embodiments, bilateral driving or other driving modes can also be adopted according to the actual needs of the display panel 1000, which is not specifically limited in the present application.

In the display panel provided by the embodiments of the present application, by adding a random location module in the GOA unit of the GOA circuit 200, the GOA circuit has a function of randomly selecting lines and outputting scanning signals during the blanking period of each frame. Thus, the purpose of randomly selecting lines for mobility detection and compensation is realized, and display image quality of the display panel 1000 is improved.

The application has been described by the relevant embodiments, however, the above embodiments are only examples of the implementation of the present invention. It must be noted that the disclosed embodiments do not limit the scope of the present invention. On the contrary, the modification and equalization of the spirit and scope included in the claims are included in the scope of the invention.

What is claimed is:

1. A gate driver on array (GOA) circuit, comprising a plurality of cascaded GOA units, and an nth level GOA unit comprising a pull-up control module, a pull-up output module, a pull-down control module, a pull-down output module, a pull-down maintenance module, and a random location module; wherein the pull-up control module is configured to receive a (n−m)th stage transmission signal and is electrically connected to a pull-up node for outputting the (n−m)th stage transmission signal to the pull-up node under a control of the (n−m)th stage transmission signal; both n and m are integers greater than 0, and n>m;

the pull-up output module is configured to receive a first clock signal and a second clock signal, and is electrically connected to the pull-up node, an nth stage scanning signal output end, and an nth stage transmission signal output end for outputting an nth stage scanning signal and an nth stage transmission signal under a control of a potential of the pull-up node, the first clock signal, and the second clock signal;

the pull-down control module is configured to receive a (n+m)th stage transmission signal, a control signal, and a first reference low-level signal, and is electrically connected to the pull-up node for pulling down the potential of the pull-up node under a control of the (n+m)th stage transmission signal, the control signal, and the first reference low-level signal;

the pull-down maintenance module is configured to receive a low-frequency clock signal, the (n−m)th stage transmission signal, the first reference low-level signal, and a second reference low-level signal, and is electrically connected to the pull-up node and a pull-down node for maintaining the potential of the pull-down node;

the pull-down output module is configured to receive the first reference low-level signal and a third reference low-level signal, and is electrically connected to the pull-down node, the nth stage scanning signal output end, and the nth stage transmission signal output end for pulling down a potential of the nth stage scanning signal and a potential of the nth stage transmission signal under a control of the first reference low-level signal and the third reference low-level signal; and the random location module is configured to receive the (n−m)th stage transmission signal, the first reference low-level signal, a selection signal, a reset signal, and a reference high-level signal for pulling up the potential of the pull-up node during a horizontal blank period under a control of the (n−m)th stage transmission signal, the first reference low-level signal, the selection signal, the reset signal, and the reference high-level signal.

2. The GOA circuit of claim 1, wherein the pull-up control module comprises a first transistor and a second transistor;

a gate electrode of the first transistor, a source electrode of the first transistor, and a gate electrode of the second transistor are configured to receive the (n−m)th stage transmission signal; a drain electrode of the first transistor and a source electrode of the second transistor are electrically connected to the first node; and a drain electrode of the second transistor is electrically connected to the pull-up node;

the pull-up output module comprises a third transistor, a fourth transistor, and a first capacitor; and a gate electrode of the third transistor, a gate electrode of the fourth transistor, and an end of the first capacitor are electrically connected to the pull-up node, a source electrode of the third transistor is configured to receive the first clock signal, a source electrode of the fourth transistor is configured to receive the second clock signal, a drain electrode of the third transistor is electrically connected to the nth stage signal output end, and a drain electrode of the fourth transistor and another end of the first capacitor are electrically connected to the nth stage scanning signal output end.

3. The GOA circuit of claim 1, wherein the pull-down control module comprises a fifth transistor, a sixth transistor, a seventh transistor, an eighth transistor, a ninth transistor, and a tenth transistor; and a gate electrode of the fifth transistor and a gate electrode of the sixth transistor are configured to receive the (n+m)th stage transmission signal, a source electrode of the fifth transistor and a drain electrode of the sixth transistor are electrically connected to the first node, and a drain electrode of the fifth transistor, a drain electrode of the seventh transistor, and a drain electrode of the ninth transistor are electrically connected to the pull-up node, a source electrode of the sixth transistor, a source electrode of the eighth transistor, and a source electrode of the tenth transistor are configured to receive the first reference low-level signal, a gate electrode of the seventh transistor and a gate electrode of the eighth transistor are configured to receive the control signal, a drain electrode of the seventh transistor and a source electrode of the eighth transistor are electrically connected to the first node, a gate electrode of the ninth transistor and a gate electrode of the tenth transistor are electrically connected to the pull-down node, and a source electrode of the ninth transistor and a drain electrode of the tenth transistor are electrically connected to the first node.

4. The GOA circuit of claim 1, wherein the pull-down maintenance module comprises an eleventh transistor, a twelfth transistor, a thirteenth transistor, a fourteenth transistor, a fifteenth transistor, a sixteenth transistor, and a seventeenth transistor; and a gate electrode of the eleventh transistor, a source electrode of the eleventh transistor, a gate electrode of the twelfth transistor, and a source electrode of the fourteenth transistor are configured to receive the reference high-level signal, a drain electrode of the eleventh transistor is connected with a source electrode of the twelfth transistor; a drain electrode of the twelfth transistor, a drain electrode of the thirteenth transistor, a gate electrode of the fourteenth transistor, and a drain electrode of the sixteenth transistor are connected together, a gate electrode of the thirteenth transistor, a gate electrode of the fifteenth transistor, and a gate electrode of the sixteenth transistor are electrically connected to the pull-up node, a source electrode of the thirteenth transistor and a source electrode of the sixteenth transistor are configured to receive the second reference low-level signal, a drain electrode of the fourteenth transistor, a drain electrode of the fifteenth transistor, and a drain electrode of the seventeenth transistor are electrically connected to the pull-down node, a source electrode of the fifteenth transistor and a source electrode of the seventeenth transistor are configured to receive the first reference low-level signal, and a gate electrode of the seventeenth transistor is configured to receive the (n−m)th stage transmission signal.

5. The GOA circuit of claim 1, wherein the pull-down output module comprises an eighteenth transistor and a nineteenth transistor; and a gate electrode of the eighteenth transistor and a gate electrode of the nineteenth transistor are electrically connected to the pull-down node, a source electrode of the eighteenth transistor is configured to receive the first reference low-level signal, a drain electrode of the eighteenth transistor is electrically connected to the nth stage signal output end, a source electrode of the nineteenth transistor is configured to receive the third reference low-level signal, and a drain electrode of the nineteenth transistor is connected to the nth stage scanning signal output end.

6. The GOA circuit of claim 1, wherein the random location module comprises a selection unit, and the selection unit comprises a twenty-first transistor, a twenty-second transistor, a twenty-third transistor, a twenty-fourth transistor, a twenty-fifth transistor, a twenty-sixth transistor, and a second capacitor; and a gate electrode of the twenty-first transistor is configured to receive the selection signal, a source electrode of the twenty-first transistor is configured to receive the (n−m)th stage transmission signal, and a drain electrode of the twenty-first transistor, a drain electrode of the twenty-second transistor, a gate electrode of the twenty-fourth transistor, a gate electrode of the twenty-fifth transistor, and one end of the second capacitor are electrically connected to the second node, a gate electrode of the twenty-second transistor, a drain electrode of the twenty-third transistor, and a drain electrode of the twenty-fourth transistor are electrically connected to the second node, a gate electrode of the twenty-third transistor, a source electrode of the twenty-third transistor, a source electrode of the twenty-fifth transistor, and another end of the second capacitor are configured to receive the reference high-level signal, a source electrode of the twenty-fourth transistor is configured to receive the first reference low-level signal, a drain electrode of the twenty-fifth transistor is connected with the source electrode of the twenty-sixth transistor, and a drain electrode of the twenty-sixth transistor is electrically connected to the pull-up node.

7. The GOA circuit of claim 6, wherein the random location module further comprises a stabilization unit, and the stabilization unit comprises a twenty-seventh transistor and a twenty-eighth transistor; and a gate electrode of the twenty-seventh transistor is configured to receive the reset signal, a source electrode of the twenty-seventh transistor is connected with a drain electrode of the twenty-eighth transistor, a drain electrode of the twenty-seventh transistor is electrically connected to the pull-down node, and a gate electrode of the twenty-eighth transistor is electrically connected to the second node, a source electrode of the twenty-eighth transistor is connected to the first low-level signal source electrode.

8. The GOA circuit of claim 1, wherein the nth level GOA unit further comprises a leakage protector module, and the leakage protector module comprises a twenty-ninth transistor and a thirtieth transistor; and a gate electrode of the twenty-ninth transistor and a gate electrode of the thirtieth transistor are electrically connected to the pull-up node, a source electrode of the twenty-ninth transistor is configured to receive the reference high-level signal, a drain electrode of the twenty-ninth transistor is connected with a source electrode of the thirtieth transistor, and a drain electrode of the thirtieth transistor is electrically connected to the first node.

9. The GOA circuit of claim 1, wherein the random location module has an output end, the output end is electrically connected to the pull-up node at least through a signal transmission line, and the GOA circuit further comprises at least a repair line, and the repair line and the signal transmission line cross and are arranged in different layers.

10. The GOA circuit of claim 9, wherein the GOA circuit comprises K first clock signals and K second clock signals, every K adjacent GOA units are configured to receive the first clock signal and the second clock signal correspondingly and respectively, and the GOA circuit comprises a plurality of repair lines, and each of the repair lines is arranged corresponding to the K adjacent GOA units.

11. The GOA circuit of claim 9, wherein each of the signal transmission lines is provided with a first laser mark, and the first laser mark is arranged at an end of a corresponding one of the signal transmission lines close to the random location module.

12. The GOA circuit of claim 9, wherein the repair line is provided with a plurality of repair marks, and intersections of a plurality of the signal transmission lines and the repair line correspond to the repair marks in a one-to-one correspondence.

13. The GOA circuit of claim 12, wherein a plurality of second laser marks are arranged on the repair line, and each of the second laser mark is arranged between two adjacent repair marks.

14. The GOA circuit of claim 13, wherein the repair marks and the second laser marks are different image marks.

15. The GOA circuit of claim 9, wherein the random location module comprises a selection unit, and the selection unit comprises a twenty-first transistor, a twenty-second transistor, a twenty-third transistor, a twenty-fourth transistor, a twenty-fifth transistor, a twenty-sixth transistor, and a second capacitor;

a gate electrode of the twenty-first transistor is configured to receive the selection signal, a source electrode of the twenty-first transistor is configured to receive the (n−m)th stage transmission signal, and a drain electrode of the twenty-first transistor, a drain electrode of the twenty-second transistor, a gate electrode of the twenty-fourth transistor, a gate electrode of the twenty-fifth transistor, and one end of the second capacitor are electrically connected to the second node, a gate electrode of the twenty-second transistor, a drain electrode of the twenty-third transistor, and a drain electrode of the twenty-fourth transistor are electrically connected to the second node, and a gate electrode of the twenty-third transistor, a source electrode of the twenty-third transistor, a source electrode of the twenty-fifth transistor, and another end of the second capacitor are configured to receive the reference high-level signal, a source electrode of the twenty-fourth transistor is configured to receive the first reference low-level signal, a drain electrode of the twenty-fifth transistor is connected with the source electrode of the twenty-sixth transistor, and a drain electrode of the twenty-sixth transistor is electrically connected to the pull-up node; and the output end is arranged at the drain electrode of the twenty-sixth transistor, alternatively the output end is arranged at the connection between the twenty-fifth transistor and the source electrode of the twenty-sixth transistor.

16. The GOA circuit of claim 9, wherein the repair line comprises a repair main line and a plurality of repair branch lines connected with the repair main line, each of the signal transmission lines comprises a transmission main line and a transmission branch line connected with the transmission main line, and the repair branch lines and the transmission branch lines extend in a same direction and are arranged in a one-to-one correspondence.

17. A display panel, comprising a display area and a non-display area connected to the display area, the display panel comprising a GOA circuit disposed in the non-display area, the GOA circuit is configured to output scanning signals to the display area, and the GOA circuit comprising:

a plurality of cascaded GOA units, wherein an nth level GOA unit comprise a pull-up control module, a pull-up output module, a pull-down control module, a pull-down output module, a pull-down maintenance module, and a random location module; wherein the pull-up control module is configured to receive a (n−m)th stage transmission signal and is electrically connected to a pull-up node for outputting the (n−m)th stage transmission signal to the pull-up node under a control of the (n−m)th stage transmission signal; both n and m are integers greater than 0, and n>m;

the pull-up output module is configured to receive a first clock signal and a second clock signal, and is electrically connected to the pull-up node, an nth stage scanning signal output end, and an nth stage transmission signal output end for outputting an nth stage scanning signal and an nth stage transmission signal under a control of a potential of the pull-up node, the first clock signal, and the second clock signal;

the pull-down control module is configured to receive a (n+m)th stage transmission signal, a control signal, and a first reference low-level signal, and is electrically connected to the pull-up node for pulling down the potential of the pull-up node under a control of the (n+m)th stage transmission signal, the control signal, and the first reference low-level signal;

the pull-down maintenance module is configured to receive a low-frequency clock signal, the (n−m)th stage transmission signal, the first reference low-level signal, and a second reference low-level signal, and is electrically connected to the pull-up node and a pull-down node for maintaining the potential of the pull-down node;

the pull-down output module is configured to receive the first reference low-level signal and a third reference low-level signal, and is electrically connected to the pull-down node, the nth stage scanning signal output end, and the nth stage transmission signal output end for pulling down a potential of the nth stage scanning signal and a potential of the nth stage transmission signal under a control of the first reference low-level signal and the third reference low-level signal; and the random location module is configured to receive the (n−m)th stage transmission signal, the first reference low-level signal, a selection signal, a reset signal, and a reference high-level signal for pulling up the potential of the pull-up node during a horizontal blank period under a control of the (n−m)th stage transmission signal, the first reference low-level signal, the selection signal, the reset signal, and the reference high-level signal.

18. The display panel of claim 17, wherein the random location module has an output end, the output end is electrically connected to the pull-up node at least through signal transmission lines, and the GOA circuit further comprises at least a repair line, and the repair line and the signal transmission line cross and are arranged in different layers.

19. The display panel of claim 18, wherein the GOA circuit comprises K first clock signals and K second clock signals, every K adjacent GOA units are configured to receive the first clock signal or the second clock signal correspondingly and respectively, and the GOA circuit comprises a plurality of repair lines, and each of the repair lines is arranged corresponding to the K adjacent GOA units.

20. The display panel of claim 17, wherein each of the signal transmission lines is provided with a first laser mark, and the first laser mark is arranged at an end of a corresponding one of the signal transmission lines close to the random location module.

* * * * *